(12) United States Patent
Massimino (10) Patent No.: US 8,907,821 B1
(45) Date of Patent: Dec. 9, 2014

(54) APPARATUS AND METHOD FOR DECODING DATA

(75) Inventor: Pascal Massimino, Cupertino, CA (US)

(73) Assignee: Google Inc., Mountain View, CA (US)

( * ) Notice: Subject to any disclaimer, the term of this patent is extended or adjusted under 35 U.S.C. 154(b) by 344 days.

(21) Appl. No.: 13/489,025

(22) Filed: Jun. 5, 2012

Related U.S. Application Data (63) Continuation of application No. 13/233,640, filed on Sep. 15, 2011, now Pat. No. 8,477,050.

(60) Provisional application No. 61/383,526, filed on Sep. 16, 2010.

(51) Int. Cl.
*H03M 7/34* (2006.01)

(52) U.S. Cl.
USPC ............. 341/51; 713/168; 713/340; 707/693; 707/698; 707/827; 382/100; 382/245; 382/253; 704/201; 704/203; 704/205; 704/207; 704/212; 375/137; 375/150; 375/377; 375/240.22; 375/240.16

(58) Field of Classification Search
USPC .......... 713/168, 303, 340; 707/693, 698, 827; 382/100, 245, 253; 704/201, 203, 205, 704/207, 212, 267, 275; 341/50–90; 375/147, 150, 377, E1.002, 240.22, 375/240.16
See application file for complete search history.

(56) References Cited

U.S. PATENT DOCUMENTS

| 5,231,484 A | 7/1993 | Gonzales et al. |
| 5,473,326 A | 12/1995 | Harrington |
| 5,589,945 A | 12/1996 | Abecassis |
| 5,606,371 A | 2/1997 | Klein Gunnewiek et al. |
| 5,659,539 A | 8/1997 | Porter et al. |
| 5,696,869 A | 12/1997 | Abecassis |

(Continued)

FOREIGN PATENT DOCUMENTS

| EP | 1947680 | 7/2008 |
| WO | WO9611457 | 4/1996 |

(Continued)

OTHER PUBLICATIONS

Al-Omari, Huthaifa, et al; "Avoiding Delay Jitter in Cyber-Physical Systems Using One Way Delay Variations Model", Computational Science and Engineering, 2009 International Conference, IEEE (Aug. 29, 2009) pp. 295-302.

(Continued)

*Primary Examiner* — Lam T Mai
(74) *Attorney, Agent, or Firm* — Young Basile Hanlon & MacFarlane P.C.

(57) ABSTRACT

A computer-implemented method and apparatus are disclosed for decoding an encoded data signal. In one embodiment, the method includes accessing, in a memory, a set of signal elements. The encoded data signal is received at a computing device. The signal includes signal fragments each having a projection value and an index value. The projection value has been calculated as a function of at least one signal element of the set of signal elements and at least a portion of the data signal. The index value associates its respective signal fragment with the at least one signal element used to calculate the projection value. The computing device determines amplitude values based on the projection values in the signal fragments. The decoded signal is determined using the amplitude values and the signal elements associated with the at least some of the signal fragments.

20 Claims, 6 Drawing Sheets

(56) References Cited

U.S. PATENT DOCUMENTS

| | | | |
|---|---|---|---|
| 5,793,647 A | 8/1998 | Hageniers et al. | |
| 5,828,370 A | 10/1998 | Moeller et al. | |
| 5,903,264 A | 5/1999 | Moeller et al. | |
| 5,910,827 A | 6/1999 | Kwan et al. | |
| 5,913,038 A | 6/1999 | Griffiths | |
| 5,930,493 A | 7/1999 | Ottesen et al. | |
| 5,943,065 A | 8/1999 | Yassaie et al. | |
| 5,963,203 A | 10/1999 | Goldberg et al. | |
| 6,011,824 A * | 1/2000 | Oikawa et al. | 375/377 |
| 6,014,706 A | 1/2000 | Cannon et al. | |
| 6,047,255 A * | 4/2000 | Williamson | 704/212 |
| 6,052,159 A | 4/2000 | Ishii et al. | |
| 6,061,821 A | 5/2000 | Schlosser | |
| 6,112,234 A | 8/2000 | Leiper | |
| 6,119,154 A | 9/2000 | Weaver et al. | |
| 6,134,352 A | 10/2000 | Radha et al. | |
| 6,185,363 B1 | 2/2001 | Dimitrova et al. | |
| 6,253,249 B1 | 6/2001 | Belzile | |
| 6,266,337 B1 | 7/2001 | Marco | |
| 6,404,817 B1 | 6/2002 | Saha et al. | |
| 6,452,950 B1 | 9/2002 | Ohlsson et al. | |
| 6,453,283 B1 * | 9/2002 | Gigi | 704/207 |
| 6,510,219 B1 | 1/2003 | Wellard et al. | |
| 6,512,795 B1 | 1/2003 | Zhang et al. | |
| 6,587,985 B1 | 7/2003 | Fukushima et al. | |
| 6,590,902 B1 | 7/2003 | Suzuki et al. | |
| 6,597,812 B1 | 7/2003 | Fallon | |
| 6,636,561 B1 | 10/2003 | Hudson | |
| 6,665,317 B1 | 12/2003 | Scott | |
| 6,683,889 B1 | 1/2004 | Shaffer et al. | |
| 6,684,354 B2 | 1/2004 | Fukushima et al. | |
| 6,700,893 B1 | 3/2004 | Radha et al. | |
| 6,707,852 B1 | 3/2004 | Wang | |
| 6,721,327 B1 | 4/2004 | Ekudden et al. | |
| 6,732,313 B2 | 5/2004 | Fukushima et al. | |
| 6,747,999 B1 | 6/2004 | Grosberg et al. | |
| 6,778,553 B1 | 8/2004 | Chou | |
| 6,792,047 B1 | 9/2004 | Bixby et al. | |
| 6,859,460 B1 | 2/2005 | Chen | |
| 6,885,986 B1 | 4/2005 | Gigi | |
| 6,918,077 B2 | 7/2005 | Fukushima et al. | |
| 6,934,258 B1 | 8/2005 | Smith et al. | |
| 7,003,039 B2 | 2/2006 | Zakhor et al. | |
| 7,068,710 B2 | 6/2006 | Lobo et al. | |
| 7,092,441 B1 | 8/2006 | Hui et al. | |
| 7,096,481 B1 | 8/2006 | Forecast et al. | |
| 7,124,333 B2 | 10/2006 | Fukushima et al. | |
| 7,180,896 B1 | 2/2007 | Okumura | |
| 7,180,901 B2 | 2/2007 | Chang et al. | |
| 7,263,644 B2 | 8/2007 | Park et al. | |
| 7,271,747 B2 | 9/2007 | Baraniuk et al. | |
| 7,295,137 B2 | 11/2007 | Liu et al. | |
| 7,356,750 B2 | 4/2008 | Fukushima et al. | |
| 7,372,834 B2 | 5/2008 | Kim et al. | |
| 7,376,880 B2 | 5/2008 | Ichiki et al. | |
| 7,379,068 B2 | 5/2008 | Radke | |
| 7,406,501 B2 | 7/2008 | Szeto et al. | |
| 7,447,235 B2 | 11/2008 | Luby et al. | |
| 7,447,969 B2 | 11/2008 | Park et al. | |
| 7,484,157 B2 | 1/2009 | Park et al. | |
| 7,502,818 B2 | 3/2009 | Kohno et al. | |
| 7,504,969 B2 | 3/2009 | Patterson et al. | |
| 7,636,298 B2 | 12/2009 | Miura et al. | |
| 7,653,867 B2 | 1/2010 | Stankovic et al. | |
| 7,680,076 B2 | 3/2010 | Michel et al. | |
| 7,719,579 B2 | 5/2010 | Fishman et al. | |
| 7,756,127 B2 | 7/2010 | Nagai et al. | |
| RE42,272 E | 4/2011 | Zakhor | |
| 8,050,446 B2 * | 11/2011 | Kountchev et al. | 382/100 |
| 8,326,061 B2 * | 12/2012 | Massimino | 382/235 |
| 8,352,737 B2 * | 1/2013 | Solis et al. | 713/168 |
| 8,477,050 B1 * | 7/2013 | Massimino | 375/150 |
| 2002/0034245 A1 | 3/2002 | Sethuraman et al. | |
| 2002/0099840 A1 | 7/2002 | Miller et al. | |
| 2002/0140851 A1 | 10/2002 | Laksono | |
| 2002/0157058 A1 | 10/2002 | Ariel et al. | |
| 2002/0159525 A1 | 10/2002 | Jeong | |
| 2002/0167911 A1 | 11/2002 | Hickey | |
| 2003/0018647 A1 | 1/2003 | Bialkowski | |
| 2003/0058943 A1 | 3/2003 | Zakhor | |
| 2003/0098992 A1 | 5/2003 | Park et al. | |
| 2003/0103681 A1 | 6/2003 | Guleryuz | |
| 2003/0193486 A1 | 10/2003 | Estrop | |
| 2003/0210338 A1 | 11/2003 | Matsuoka et al. | |
| 2003/0226094 A1 | 12/2003 | Fukushima et al. | |
| 2004/0017490 A1 | 1/2004 | Lin | |
| 2004/0146113 A1 | 7/2004 | Valente | |
| 2004/0165585 A1 | 8/2004 | Imura et al. | |
| 2005/0024384 A1 | 2/2005 | Evans et al. | |
| 2005/0063586 A1 | 3/2005 | Munsil et al. | |
| 2005/0104979 A1 | 5/2005 | Fukuoka et al. | |
| 2005/0111557 A1 | 5/2005 | Kong et al. | |
| 2005/0154965 A1 | 7/2005 | Ichiki et al. | |
| 2005/0180415 A1 | 8/2005 | Cheung et al. | |
| 2005/0220444 A1 | 10/2005 | Ohkita et al. | |
| 2005/0259690 A1 | 11/2005 | Garudadri et al. | |
| 2005/0281204 A1 | 12/2005 | Karol et al. | |
| 2006/0150055 A1 | 7/2006 | Quinard et al. | |
| 2006/0164437 A1 | 7/2006 | Kuno | |
| 2006/0200733 A1 | 9/2006 | Stankovic et al. | |
| 2006/0256232 A1 | 11/2006 | Noguchi | |
| 2006/0268124 A1 | 11/2006 | Fishman et al. | |
| 2007/0168824 A1 | 7/2007 | Fukushima et al. | |
| 2007/0189164 A1 | 8/2007 | Smith et al. | |
| 2007/0230585 A1 | 10/2007 | Kim et al. | |
| 2007/0233707 A1 | 10/2007 | Osmond et al. | |
| 2007/0255758 A1 | 11/2007 | Zheng et al. | |
| 2007/0269115 A1 | 11/2007 | Wang et al. | |
| 2008/0005201 A1 | 1/2008 | Ting et al. | |
| 2008/0008239 A1 | 1/2008 | Song | |
| 2008/0046249 A1 | 2/2008 | Thyssen et al. | |
| 2008/0052630 A1 | 2/2008 | Rosenbaum et al. | |
| 2008/0055428 A1 | 3/2008 | Safai | |
| 2008/0065633 A1 | 3/2008 | Luo et al. | |
| 2008/0101403 A1 | 5/2008 | Michel et al. | |
| 2008/0124041 A1 | 5/2008 | Nielsen et al. | |
| 2008/0130756 A1 | 6/2008 | Sekiguchi et al. | |
| 2008/0170793 A1 | 7/2008 | Yamada et al. | |
| 2008/0209300 A1 | 8/2008 | Fukushima et al. | |
| 2008/0211931 A1 | 9/2008 | Fujisawa et al. | |
| 2008/0225735 A1 | 9/2008 | Qiu et al. | |
| 2008/0291209 A1 | 11/2008 | Sureka et al. | |
| 2009/0007159 A1 | 1/2009 | Rangarajan et al. | |
| 2009/0052543 A1 | 2/2009 | Wu et al. | |
| 2009/0073168 A1 | 3/2009 | Jiao et al. | |
| 2009/0103606 A1 | 4/2009 | Lu et al. | |
| 2009/0110055 A1 | 4/2009 | Suneya | |
| 2009/0164655 A1 | 6/2009 | Pettersson et al. | |
| 2009/0172116 A1 | 7/2009 | Zimmet et al. | |
| 2009/0213940 A1 | 8/2009 | Steinbach et al. | |
| 2009/0219994 A1 | 9/2009 | Tu et al. | |
| 2009/0249158 A1 | 10/2009 | Noh et al. | |
| 2009/0271814 A1 | 10/2009 | Bosscha | |
| 2009/0284650 A1 | 11/2009 | Yu et al. | |
| 2010/0111489 A1 | 5/2010 | Presler | |
| 2010/0150441 A1 | 6/2010 | Evans et al. | |

FOREIGN PATENT DOCUMENTS

| | | |
|---|---|---|
| WO | WO9949664 | 9/1999 |
| WO | WO0233979 | 4/2002 |
| WO | WO02062072 | 8/2002 |
| WO | WO02067590 | 8/2002 |
| WO | WO02078327 | 10/2002 |
| WO | WO03043342 | 5/2003 |

OTHER PUBLICATIONS

Bagni, D.—A constant quality single pass vbr control for dvd recorders, IEEE, 2003, pp. 653-662.

Balachandran, et al., Sequence of Hashes Compression in Data Deduplication, Data Compression Conference, Mar. 2008, p. 505, issue 25-27, United States.

(56) References Cited

OTHER PUBLICATIONS

Begen, Ali C., et al; "An Adaptive Media-Aware Retransmission Timeout Estimation Method for Low-Delay Packet Video", IEEE Transactions on Multimedia, vol. 9, No. 2 (Feb. 1, 2007) pp. 332-347.

Begen, Ali C., et al; "Proxy-assisted interactive-video services over networks wit large delays", Signal Processing: Image Communication, vol. 20, No. 8 (Sep. 1, 2005) pp. 755-772.

Cui, et al., Opportunistic Source Coding for Data Gathering in Wireless Sensor Networks, IEEE Int'l Conf. Mobile Ad Hoc & Sensor Systems, Oct. 2007, http://caltechcstr.library.caltech.edu/569/01 HoCuiCodingWirelessSensorNetworks.pdf, United States.

David Slepian and Jack K. Wolf, Noiseless Coding of Correlated Information Sources, IEEE Transactions on Information Theory; Jul. 1973; pp. 471-480; vol. 19, United States.

Extended European Search Report EP09171120, dated Aug. 2, 2010.

Feng, Wu-chi; Rexford, Jennifer; "A Comparison of Bandwidth Smoothing Techniques for the Transmission of Prerecorded Compressed Video", Paper, 1992, 22 pages.

Friedman, et al., "RTP: Control Protocol Extended Reports (RTPC XR)," Network Working Group RFC 3611 (The Internet Society 2003) (52 pp).

Fukunaga, S. (ed.) et al., MPEG-4 Video Verification Model VM16, International Organisation for Standardisation ISO/IEC JTC1/SC29/WG11 N3312 Coding of Moving Pictures and Audio, Mar. 2000.

Ghanbari Mohammad, "Postprocessing of Late Calls for Packet Video", IEEE Transactions on Circuits and Systems for Video Technology, vol. 6, No. 6, Dec. 1996, 10 pages.

Gustafsson, F., Adaptive Filtering and Change Detection, John Wile & Sons, LTd, 2000.

He, Z. et al., A Linear Source Model and a Unified Rate Control Algorithm for DCT Video Coding, IEEE Transactions on Circuits and Systems for Video Technogy, Nov. 22, 2000.

Implementors' Guide; Series H: Audiovisual and Multimedia Systems; Coding of moving video: Implementors Guide for H.264: Advanced video coding for generic audiovisual services. H.264. International Telecommunication Union. Version 12. Dated Jul. 30, 2010.

Keesman, G.—Bit-rate control for MPEG encoders, Signal Processing Image communication 6 (1995) 545-560.

Khronos Group Inc. OpenMAX Integration Layer Application Programming Interface Specification. Dec. 16, 2005, 326 pages, Version 1.0.

Wang, Yao "Error Control and Concealment for Video Communication: A Review", Proceedings of the IEEE, vol. 86, No. 5, May 1998, 24 pages.

Woo-Shik Kim et al: "Enhancements to RGB coding in H.264/MPEG-4 AVC. FRExt", Internet Citation, Apr. 16, 2005, XP002439981, Retrieved from the internet: URL:ftp3.itu.ch/av-arch/video-site/0504_Bus/VCEG-Z16.doc, retrieved on Jun. 28, 2007 p. 5.

Laoutaris, Nikolaos, et al; "Intrastream Synchronization for Continuous Media Streams: A Survey of Playout Schedulers", IEEE Network, IEEE Service Center, vol. 16, No. 3 (May 1, 2002) pp. 30-40.

Li, A., "RTP Payload Format for Generic Forward Error Correction", Network Working Group, Standards Track, Dec. 2007, (45 pp).

Liu, Haining, et al; "On the Adaptive Delay and Synchronization Control of Video Conferencing over the Internet", International Conference on Networking (ICN) (2004) 8 pp.

Liu, Hang, et al; "Delay and Synchronization Control Middleware to Support Real-Time Multimedia Services over Wireless PCS Networks", IEEE Journal on Selected Areas in Communications, IEEE Service Center, vol. 17, No. 9 (Sep. 1, 1999) pp. 1660-1672.

Nethercote, Nicholas, et al,; "How to Shadow Every Byte of Memory Used by a Program", Proceedings of the 3rd International Conference on Virtual Execution Environments, Jun. 13-15, 2007 San Diego CA, pp. 65-74.

Overview; VP7 Data Format and Decoder. Version 1.5. On2 Technologies, Inc. Dated Mar. 28, 2005.

Page, E. S., "Continuous Inspection Schemes"; Biometrika 4l; Statistical Laboratory, University of Cambridge, (1954); pp. 100-115.

Roca, Vincent, et al., Design and Evaluation of a Low Density Generator Matrix (LDGM) Large Block FEC Codec, INRIA Rhone-Alpes, Planete project, France, Date Unknown, (12 pp).

Schulzrinne, H., et al. RTP: A Transport Protocol for Real-Time Applications, RFC 3550. The Internet Society. Jul. 2003.

Sekiguchi S. et al.: "CE5: Results of Core Experiment on 4:4:4 Coding", JVT Meeting: Mar. 31, 2006-Jul. 4, 2006 Geneva, CH; (Joint Videoteam of ISO/IEC JTC1/SC29/WG11 and ITU-T Sg. 16), No. JVT-S014, Apr. 1, 2006 pp. 1-19.

Series H: Audiovisual and Multimedia Systems; Infrastructure of audiovisual services—Coding of moving video. H.264. Advanced video coding for generic audiovisual services. International Telecommunication Union. Version 11. Dated Mar. 2009.

Series H: Audiovisual and Multimedia Systems; Infrastructure of audiovisual services—Coding of moving video. H.264. Advanced video coding for generic audiovisual services. International Telecommunication Union. Version 12. Dated Mar. 2010.

Series H: Audiovisual and Multimedia Systems; Infrastructure of audiovisual services—Coding of moving video. H.264. Amendment 2: New profiles for professional applications. International Telecommunication Union. Dated Apr. 2007.

Series H: Audiovisual and Multimedia Systems; Infrastructure of audiovisual services—Coding of moving video. H.264. Advanced video coding for generic audiovisual services. Version 8. International Telecommunication Union. Dated Nov. 1, 2007.

Series H: Audiovisual and Multimedia Systems; Infrastructure of audiovisual services—Coding of moving video; Advanced video coding for generic audiovisual services. H.264. Amendment 1: Support of additional colour spaces and removal of the High 4:4:4 Profile. International Telecommunication Union. Dated Jun. 2006.

Series H: Audiovisual and Multimedia Systems; Infrastructure of audiovisual services—Coding of moving video; Advanced video coding for generic audiovisual services. H.264. Version 1. International Telecommunication Union. Dated May 2003.

Series H: Audiovisual and Multimedia Systems; Infrastructure of audiovisual services—Coding of moving video; Advanced video coding for generic audiovisual services. H.264. Version 3. International Telecommunication Union. Dated Mar. 2005.

Sunil Kumar Liyang Xu, Mrinal K. Mandal, and Sethuraman Panchanathan, Error Resiliency Schemes in H.264/AVC Standard, Elsevier J. of Visual Communicatio & Image Representation (Special issue on Emerging H.264/AVC Video Coding Standard), vol. 17 (2), Apr. 2006.

Wang, et al., Distributed Data Aggregation using Clustered Slepian-Wolf Coding in Wireless Sensor Networks, IEEE International Conference on Communications, Jun. 2007, pp. 3616-3622, United States.

Tsai, et al., The Efficiency and Delay of Distributed Source Coding in Random Access Sensor Networks, 8th IEEE Wireless Communications and Networking Conference, Mar. 2007, pp. 786-791, United States.

Vasudev Bhaskaran et al., "Chapter 6: The MPEG Video Standards", Image and Video Compression Standards—Algorithms & Architectures, Second Edition, 1997, pp. 149-230 Kluwer Academic Publishers.

VP6 Bitstream & Decoder Specification. Version 1.02. On2 Technologies, Inc. Dated Aug. 17, 2006.

VP6 Bitstream & Decoder Specification. Version 1.03. On2 Technologies, Inc. Dated Oct. 29, 2007.

\* cited by examiner

APPARATUS AND METHOD FOR DECODING DATA

CROSS-REFERENCE TO RELATED APPLICATIONS

This application is a continuation of U.S. patent application Ser. No. 13/233,640, filed Sep. 15, 2011, the disclosure of which is hereby incorporated by reference in its entirety, which in turn is a non-provisional application claiming the benefit of on U.S. Pat. Appl. Ser. No. 61/383,526 filed Sep. 16, 2010, the disclosure of which is hereby incorporated by reference in its entirety.

TECHNICAL FIELD

The present invention relates in general to data transmission including redundant data transmission.

BACKGROUND

Data communications protocols such as Transmission Control Protocol have been developed over many years. These protocols transmit data in packets, which can be lost during transmission due to a variety of factors, such as transmission errors and network congestion. To address this problem, it is known to provide data redundancy, in which a packet is transmitted more than once. For example, a space satellite can transmit a low bit rate signal over a lossy forward link to a receiving station. The satellite may not have a return link to communicate whether a packet is received. Therefore, the satellite transmits redundant packets to increase the probability of successful reconstruction of the signal at the receiving station.

SUMMARY

Apparatuses and methods for redundant transmission of data are disclosed. One aspect of the disclosed embodiments is a method for decoding an encoded data signal. The computer-implemented method includes accessing in a memory a set of signal elements and receiving an encoded data signal at a computing device. The encoded data signal includes a plurality of signal fragments each having a projection value that has been calculated as a function of at least one signal element of the set of signal elements and at least a portion of the encoded data signal, and a value associating each respective signal fragment with the at least one signal element used to calculate the projection value. The computing device determines a plurality of amplitude values wherein at least one of the plurality of amplitude values is based on the projection value in at least one of the plurality of signal fragments. A decoded signal is determined using the plurality of amplitude values and signal elements associated with the at least one of the plurality of signal fragments.

In another aspect of the disclosed embodiments, a method is taught for decoding an encoded data signal. The computer-implemented method includes accessing in a memory a set of signal elements and receiving, at a computing device, the encoded data signal including a plurality of signal fragments each having a projection value and an index value. A plurality of selected signal elements are identified from the set of signal elements stored in the memory, at least one of the selected signal elements corresponds to the index value in at least one of the plurality of signal fragments. The computing device determines a decoded data signal based on the plurality of selected signal elements and at least one projection value included in the plurality of signal fragments.

In yet another aspect of the disclosed embodiments, an apparatus is taught for decoding an encoded data signal. The apparatus comprises a memory including a set of signal elements and a processor in communication with the memory. The processor is configured to execute instructions to receive the encoded data signal including a plurality of signal fragments each having a projection value and an index value; identify, using at least one index value included in the plurality of signal fragments, a plurality of selected signal elements in the set of signal elements; and determine a decoded data signal based on the plurality of selected signal elements and at least one projection value included in the plurality of signal fragments.

BRIEF DESCRIPTION OF THE DRAWINGS

The description herein makes reference to the accompanying drawings wherein like reference numerals refer to like parts throughout the several views, and wherein.

DETAILED DESCRIPTION

In one embodiment, a signal (S) is decomposed during encoding into a plurality of data elements or fragments. In general terms, each fragment includes an index value and a projection value. The index value points to an entry in a dictionary or other data structure of signal elements $U_i$. This encoding process can take place iteratively so that signal fragments are added one-by-one to a growing list of fragments until the list contains sufficient fragments to permit adequate reconstruction of the original signal S.

The first step in this iterative process can include generating a reconstructed signal (REC) by decoding the fragments already in the list. This step can be skipped for the first iteration if the list is empty. Alternatively, the list can be initialized with an arbitrarily selected signal element selected without use of the reconstructed signal REC. A residual signal (R) is determined by subtracting the reconstructed signal REC from the original signal S. If the residual signal R is at or below a threshold (which can be zero), encoding processing can be completed. Otherwise, a new fragment is added to the list of fragments.

In one illustrative embodiment, the process of adding a new fragment begins by searching the dictionary for the signal element $U_i$ that maximizes the scalar product $<R, U_i>$, where R is the residual signal. The new fragment can include the value of i (the location in the dictionary where the selected signal element $U_i$ resides) and a projection value, which can be equal to the scalar product of <S, $U_i$>. Next, the new fragment is added to the existing list of fragments. A repetition factor is assigned to the new fragment. In one illustrative embodiment, the repetition factor can be a monotonic function of the scalar product's absolute value <R, $U_i$>, which provides an indication of the transfer energy associated with (and thus may indicate the relative importance of) the fragment. In the output (Y) of the encoder, the fragment can be duplicated depending on the value of the repetition factor. The dictionary entry corresponding to the newly-added fragment is deleted or flagged so that it will not be used in a subsequently generated fragment.

The process of decoding is used by the encoder itself (to create the reconstructed signal REC as described above) and also by a decoder in a receiving station that receives the encoded signal. The decoding process can begin by removing duplicate fragments having the same index value. An array of amplitude values $A_0 \ldots A_N$ is determined for the N remaining fragments by performing a transform using the projection values contained in at least a plurality of fragments. The reconstructed signal REC can then be generated by computing the sum over all N fragments of $A_k * U_{i,k}$.

Figure 1:
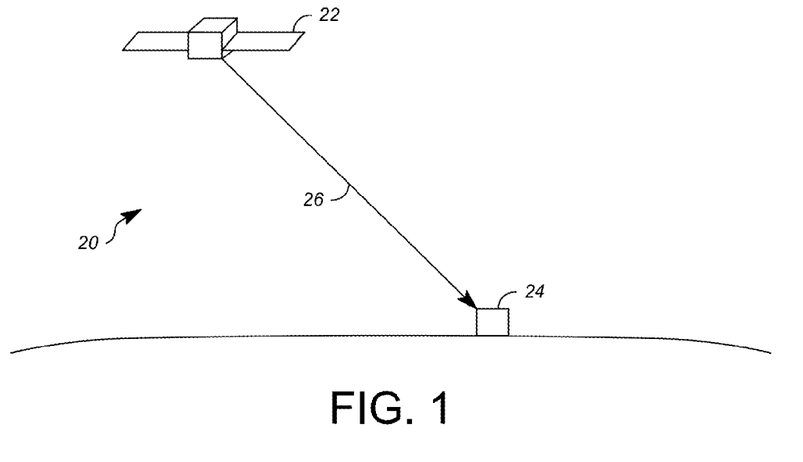
FIG. 1 is a schematic diagram of a communications network including a transmission station.

FIG. 1 is a schematic diagram of one exemplary embodiment in which a communications network 20 includes a transmission station 22, which in this illustration is a space-borne satellite, and a receiving station 24, which in this case is a mobile tracking device coupled to a moving vehicle (not shown). Transmission station 22 communicates with receiving station 24 by broadcasting a packetized radio-frequency signal over a lossy forward link 26.

Communications network 20 can be implemented in a variety of configurations, and the embodiment of FIG. 1 is shown merely for illustration. For example, transmission station 22 can be a terrestrial radio or laser transmitter (e.g., used in fiber optic communications) or a computer coupled to a network. Forward link 26 can be wireless or wired, or a combination of both. A variety of transport protocols could be employed in forward link 26.

Owing to power constraints, weather conditions or other circumstances, there may be no return link to permit transmission of data from receiving station 24 to transmission station 22. As a result, transmission station 22 can send data to receiving station 24 without acknowledgment of the reception of packets. In other embodiments, a return link can be provided so that transmission station 22 and receiving station 24 can have full or partial bi-directional communication.

Forward link 26 can be lossy, owing to poor signal quality, transmission error, network congestion, signal obstruction or other causes. If forward link 26 is lossy, packets transmitted between transmission station 22 and receiving station 24 can be lost, resulting in signal degradation. To ensure successful transmission, transmission station 22 can transmit redundant packets of data along forward link 26. This consumes bandwidth and it can be beneficial if the redundant transmission is optimized to maximize the fidelity of the reconstructed signal at receiving station 24.

It will be understood that the term packets as used in this specification is used in its broadest sense and includes datagrams, segments, blocks, cells and/or frames depending on the transmission protocol that is used. The embodiments as described herein can be used with a range of protocols and the invention is not intended to be limited to any one particular protocol.

Figure 2:
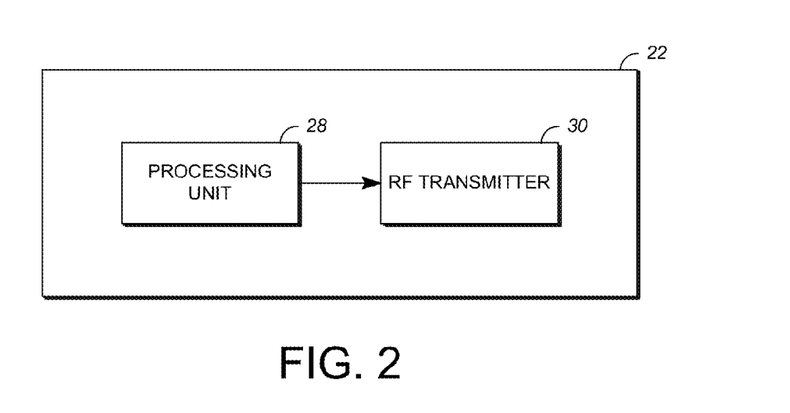
FIG. 2 is a block diagram of the transmission station shown in FIG. 1.

FIG. 2 is a block diagram of the transmission station 22 shown in FIG. 1. In one exemplary embodiment, transmission station 22 includes a processing unit 28 and a transmitter, e.g., radio frequency (RF) transmitter 30. Processing unit 28 performs the encoding of data described below and RF transmitter 30 transmits the resulting encoded signal using radio frequency(ies). Processing unit 28 can be realized in hardware, software, or any combination thereof including, for example, IP cores, ASICS, programmable logic arrays, programmable logic controllers, microcode, firmware, microcontrollers, microprocessors, digital signal processors or any other suitable implementation. Processing unit 28 can alternatively include a general purpose computer/processor with a computer program that, when executed, carries out any of the respective methods, algorithms and/or instructions described herein. In addition or alternatively, for example, a special purpose computer/processor can be utilized which can contain specialized hardware for carrying out any of the methods, algorithms and/or instructions described herein.

Figure 3:
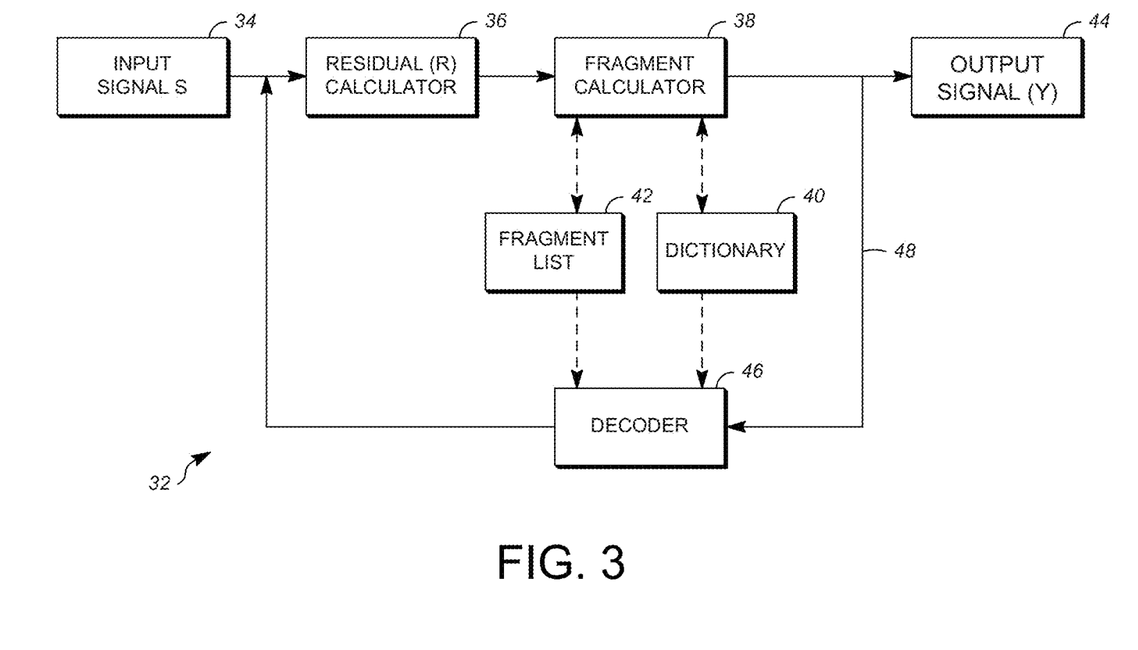
FIG. 3 is a block diagram of the encoder used in the transmission station of FIG. 1.
Figure 4:
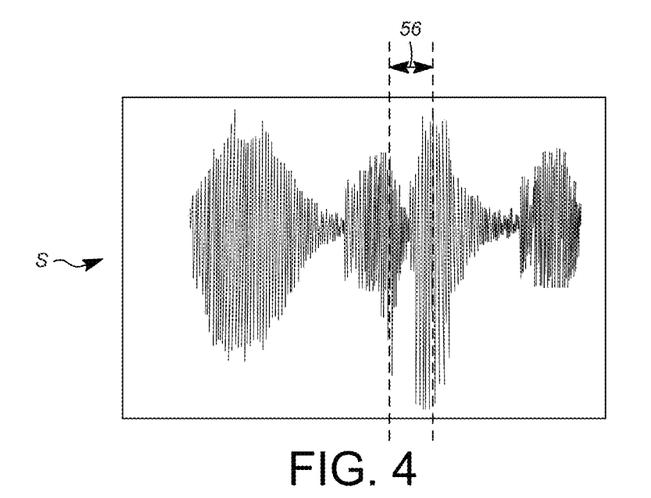
FIG. 4 is a pictorial representation of an audio signal to be encoded by the encoder of FIG. 3.
Figure 5:
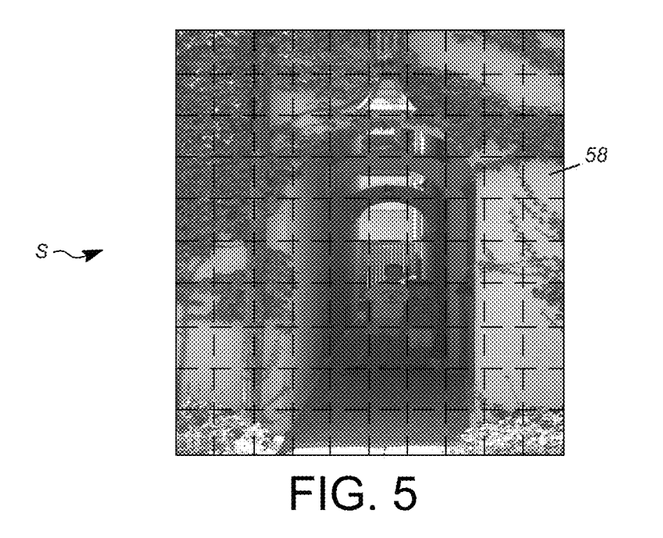
FIG. 5 is a pictorial representation of a video signal to be encoded by the encoder of FIG. 3.

FIG. 3 is a block diagram of an encoder 32 used in the transmission station 22 of FIG. 1. In one exemplary embodiment, encoder 32 can be implemented by or in processing unit 28, as explained above. Generally speaking, encoder 32 accepts as input a data signal S, such as an audio signal (FIG. 4) or video signal (FIG. 5). Encoder 32 encodes the input signal S by decomposing it into a sequence or list of fragments (hereinafter referred to as fragment list 42). The fragments of fragment list 42 are described below, but generally each includes an index value and a projection value. Fragment list 42 is included in an output signal Y transmitted by a signal transmitting stage 44 on forward link 26 to receiving station 24. Certain fragments can be identified as having a higher level of importance than others. A higher quality reconstruction can be achieved if these more important fragments are successfully transmitted. Therefore, encoder 32 transmits more important fragments multiple times to increase the probability that at least one copy of the each of the important fragments is received by receiving station 24. However, as explained below, the loss of packets containing a given fragment (even a so-called important fragment) need not substantially degrade the reconstructed signal, which is generated using the data in multiple fragments.

Still referring to FIG. 3, encoder 32 has various stages to perform its encoding functions. These functions are described in more detail with reference to FIGS. 9 and 10. In one exemplary embodiment, the stages of encoder 32 can include a signal receiving stage 34, where an input signal S is accepted; a residual calculator stage 36 in which the input signal S is compared to a reconstructed signal REC to produce a residual signal R; a fragment calculator stage 38, where a new fragment is determined using the content of a dictionary 40, described below; and a decoder 46. The new fragment is added to fragment list 42. The structure of fragment list 42 is explained below in conjunction with FIG. 8. When encoding processing is complete, the final fragment list 42 is transmitted as a component of output signal Y via the signal transmitting stage 44. As explained below, in some embodiments, selected fragments of fragment list 42 can be duplicated in output signal Y to provide redundancy. Encoder 32 can further compress output signal Y through entropy coding, for example. This further compression can be done in a context-free fashion so that each fragment can be compressed independently and does not depend on information in other fragments (as these can be lost in transmission). One suitable entropy coding scheme is Huffman coding.

Exemplary structures for the fragments, fragment list and dictionary are described below. Dictionary 40 and fragment list 42 can be stored in any suitable memory (such as RAM or disk storage) and can both reside on the same physical storage area or can reside on different storage areas of the same or different types.

Encoder 32 includes a decoder stage 46 in a return path 48. Decoder stage 46 generates a reconstruction signal REC of input signal S. Reconstruction signal REC is synthesized from the fragment list 42 using the dictionary 40. An example of the operation of decoder stage 46 is provided in FIG. 10 below. Residual calculator stage 36 uses reconstruction signal REC to determine a residual signal R. As explained below in more detail, when residual signal R is at or below a threshold, encoding processing can terminate.

Input signal S can be data of any type, but in some applications can be audio or video. FIG. 4 is a pictorial representation of input signal S in the form of an audio signal to be encoded by the encoder 32 of FIG. 3. FIG. 5 is a pictorial representation of input signal S in the form of a video signal to be encoded by encoder 32 of FIG. 3.

Figure 6:
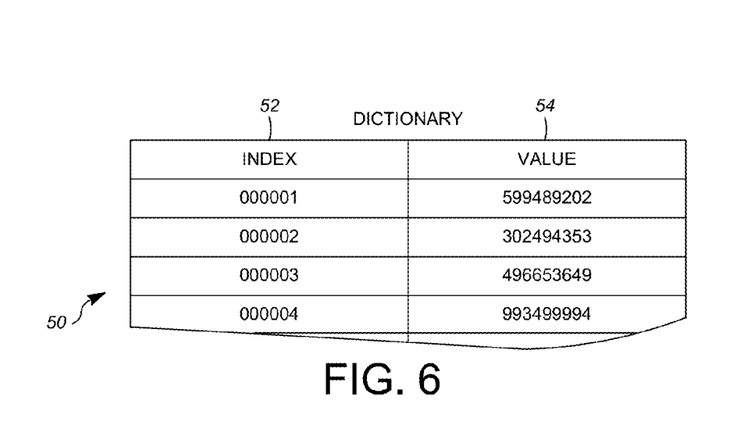
FIG. 6 is a diagram of a dictionary used by the data encoder of FIG. 3 and the decoder of FIG. 7.

Referring to FIG. 6, the structure and function of dictionary 40 is explained. Dictionary 40 is used by encoder 32 of FIG. 3 (and dictionary 64 is used by the decoder 60 of FIG. 7) to reconstruct an approximation of input signal S using the fragment list 42 generated by encoder 32. In one exemplary embodiment, dictionary 40 can be a relational database that comprises a plurality of rows or records 50. Each record can have an index field 52 and a value field 54. The index field contains an integer (i) that serves as a primary key to dictionary 40, uniquely identifying each of rows 50. The value field 54 contains a value $U_i$, which can correspond mathematically to a component of input signal S. For example, a particular value contained in value field 54 can correspond to a sample 56 of an audio input signal S as shown in FIG. 4. Alternatively, a particular value in value field 54 can correspond to a block 58 of a video input signal S as shown in FIG. 5. Value field 54 can contain a scalar, a vector or array, or a matrix, although it is illustrated as containing a scalar in FIG. 6. The values $U_i$ of dictionary 40 are referred to herein generally as signal elements, and can form an over-complete set so that any signal can be recovered by at least one finite weighted sum of the dictionary entries. The values of value field 54 are real numbers that can be normalized so that the sum of their squares equals one.

Dictionary 40 can be optimized based on the particular type or category of signal used as input. In some cases, for example, dictionary 40 can be comprised of synthesized samples such as time-translated sinusoidal audio waves or Fourier basis. Alternatively, dictionary 40 can comprise signal elements that are random excerpts from actual signals. The entries in dictionary 40 can be combined and trimmed with genetic algorithms, for example. The dictionary can be updated over time based on empirical results to improve performance of encoder 32. Dictionaries 40 and 64 can be implemented in the form of any suitable data structure, such as a relational database table, list, metadata repository, associative array or any other structure that can store signal elements in a manner that permits the elements to be looked-up, referenced or otherwise accessed such as for example by using an index value. The term "dictionary" refers to all such structures. In the exemplary embodiments, the index values stored in fragment list 42 are intended to match unique index values of a dictionary such as the values of index field 52 of dictionary 40. Other implementations for looking up signal elements (such as hashing of index values) can be used as well and the term "index" refers to all such implementations by which a value can be used to locate a signal element in a dictionary.

Figure 7:
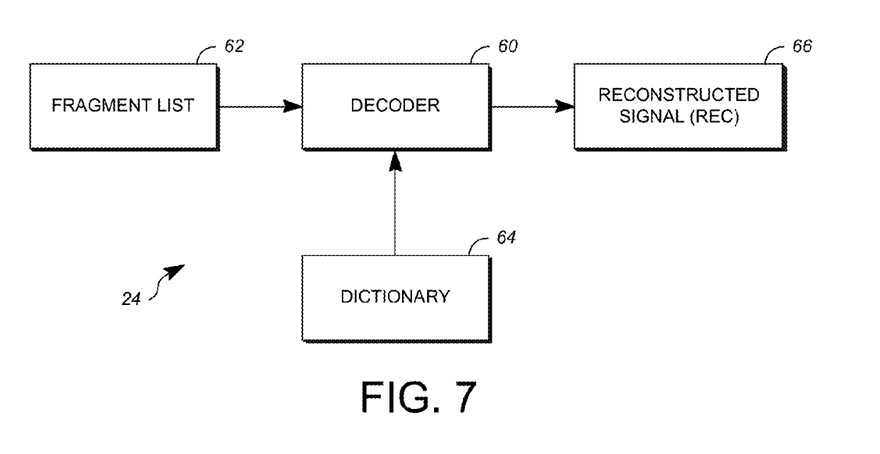
FIG. 7 is a block diagram of the receiving station of FIG. 1.

FIG. 7 is a block diagram of receiving station 24 of FIG. 1. In one exemplary embodiment, receiving station 24 includes a decoder 60 that operates in a manner similar to decoder stage 46 in encoder 32 (FIG. 3). Decoder 60 receives as input an input fragment list 62. Subject to transmission losses, fragment list 62 can be identical to output signal Y of encoder 32, which can include duplicate fragments that are generated for redundancy. Input fragment list 62 may not be a complete rendition of output signal Y because packets may have been lost during transmission on forward link 26. Decoder 60 processes input fragment list 62 using a dictionary 64, which is a copy of dictionary 40 used by encoder 32 (FIG. 3). Decoder 60 can be provisioned with dictionary 64 when it is first published, and dictionary 64 can be periodically updated to synchronize with dictionary 40. For example, dictionary 40 can include a version header which can be inspected by decoder 60 to determine whether the dictionary 64 is the same version as the dictionary 40 used by encoder 32. If dictionary 64 is not the same version, decoder 60 can request an update to its dictionary 64 such as from the publisher of decoder 60 or other online service provider. An example of the operation of decoder 60 is provided below in conjunction with FIG. 10. The output of decoder 60 is a reconstructed signal REC 66 that is an approximation of the original input signal S.

Figure 8:
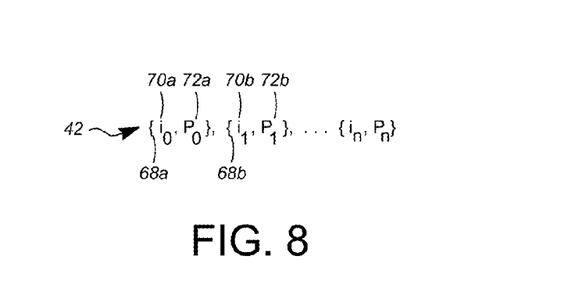
FIG. 8 is a diagram of a fragment list generated as output by the data encoder of FIG. 3.

FIG. 8 is a diagram of a fragment list 42 generated by encoder 32 and transmitted by signal transmitting stage 44 as part of output signal Y. Fragment list includes a plurality of 1 . . . N fragments (such as 68a and 68b, and generically referred to herein as fragments 68). Each fragment 68 includes an index value field 70 (such as 70a and 70b and generically referred to herein as index value) and a projection value field 72 (such as 72a and 72b and generically referred to herein as projection value). The value contained in index value field 70 is an integer (i) pointing to the $i^{th}$ record in dictionary 40 and dictionary 64. An individual fragment is sometimes referred to herein as the $k^{th}$ fragment of fragment list 42. The illustrated structure is just one of many ways in which the data of fragment list 42 can be structured. In some cases, additional fields can be included in each element. Fragment list 42 can be implemented using links and pointers in a computer memory or in a database, such as a relational database for example. As explained above in regard to FIG. 6, dictionary 40 (as well as dictionary 64) comprises a plurality of records 50 having an index field 52. Thus, value (i) in the index value field 70 of a given fragment 68 points to that one of records 50 of dictionary 40 for example having the same value (i) in its index field 52. The value contained in projection value field 72 can be a real number $P_k$ such as between −1 and +1. An exemplary technique for calculating the $P_k$, the value of projection value field 72, is provided below in conjunction with FIG. 9. In general terms, the projection value is a transform value that can be used to derive amplitudes of the signal elements $U_i$. These amplitude values in turn are used to derive the reconstructed signal REC. Accordingly, each fragment 68 can be a pair of values (index value and projection) and these pairs of values can be stored in a fragment list 42 that is generated by encoder 32. Alternatively, in place of an index, the underlying dictionary value (e.g., in value field 54) of signal element $U_i$ can be included in the fragment 68.

Figure 9:
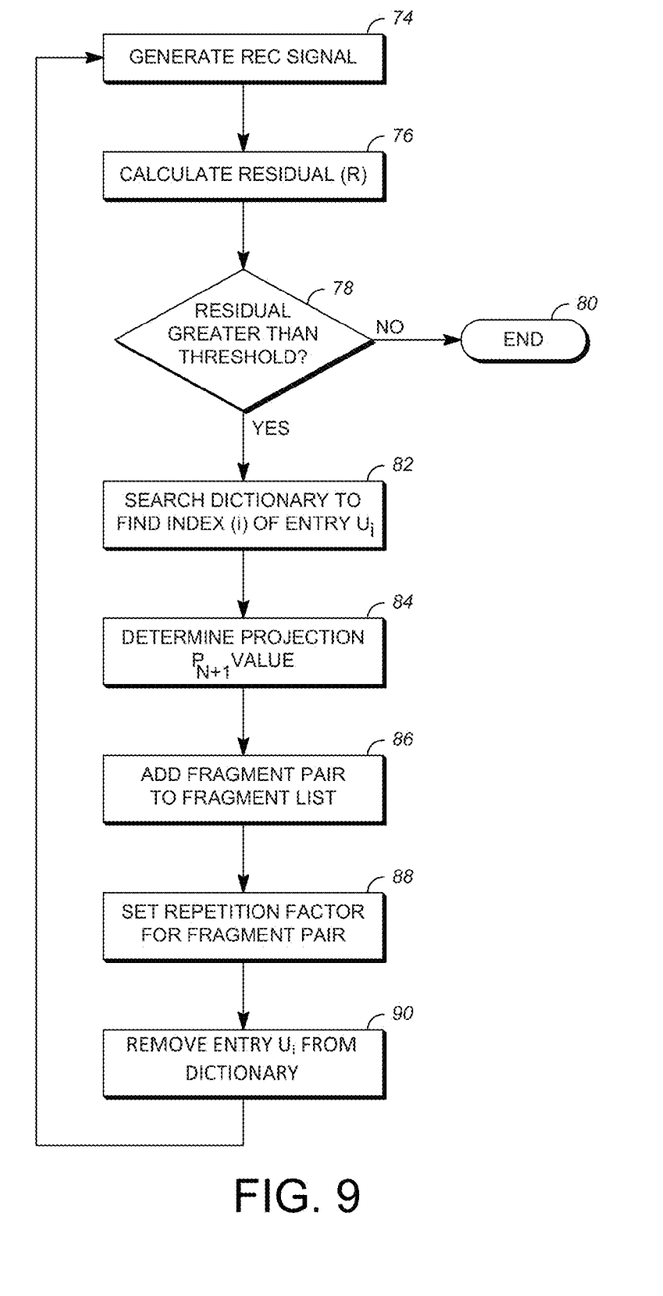
FIG. 9 is a logic flow chart illustrating operation of the encoder of FIG. 3.

FIG. 9 is a logic flow chart illustrating the iterative operation of encoder 32 in one illustrative embodiment. Beginning at block 74, decoder stage 46 (FIG. 3) generates a reconstructed signal REC of the original input signal S using fragment list 42. The operations that occur at block 74 are detailed below in conjunction with FIG. 10. For the first iteration of the logic of FIG. 9, the fragment list may be empty. Therefore, block 74 can be skipped (and the initial reconstructed signal REC set to zero). Next at block 76, residual calculator stage 36 (FIG. 3) generates a residual signal R. This can be accomplished in any suitable fashion, such as for example by subtracting reconstructed signal REC from the input signal S to obtain a residual signal R. At decision block 78, residual signal R is compared to a threshold value. In this example, the squared sum of the pixel values of the residual signal R is compared to the threshold value, which for purposes of illustration can be a number equal to or greater than zero. The threshold value can be based on the desired level of fidelity to be achieved in the coding of input signal S. If it is determined at block 78 that the residual signal R (or value based on the residual signal R) is at or below the threshold value (that is, that a desired level of fidelity has been attained), then encoding process of FIG. 9 terminates at block 80. Otherwise, if the residual signal R (or a value based on residual signal R) is above the threshold value, then processing continues on to blocks 82 through 90, as described below where a new fragment N+1 will be generated and added to the existing list of N fragments 42. Blocks 82 through 90 correspond to fragment calculator stage 38 of FIG. 3. The new fragment will be stored in fragment list 42. Accordingly, signal fragments may be generated sequentially until the fidelity of the reconstructed signal reaches a desired level.

Beginning with block 82, a search is made of dictionary 40 to find that one of the records 50 (FIG. 6) having a desired value $U_i$ in its field 54. The criteria for selecting the desired value of $U_i$ can vary, but in this case the criterion is that the value $U_i$ is selected that maximizes the absolute value of the scalar product of $<R,U_i>$ of residual signal R and the dictionary values $U_i$ for all dictionary entries not yet used in a fragment. As explained above, residual signal R is based on the reconstruction signal REC obtained using the current fragment list of N fragments $\{i_0, P_0\} \ldots \{i_N, P_N\}$.

Any suitable technique can be used to compute that scalar products referred to above. For example, the scalar product of two vectors $u=\{u_i\}_{i=1\ldots N}$ and $v=\{v_i\}_{i=1\ldots N}$ can be expressed as:

$$<u, v> = \sum_{i=1}^{N} u_i * v_i \quad \text{(Equation 1)}$$

Having located the desired dictionary record, control moves to block 84, where the value of projection $P_{N+1}$ is determined for use in the new fragment (N+1). The value $P_{N+1}$ can be determined as a function of the original input signal S and the value $U_{i,N+1}$ of the newly selected dictionary record. In this case, for example, the value $P_{N+1}$ can be calculated as the scalar product of the input signal S and the newly selected $U_i$:

$$P_{N+1} = <S, U_{i,N+1}> \quad \text{(Equation 2)}$$

Control then moves to block 86, where a new fragment is created and appended to to the existing list of N fragments as new fragment $\{i_{N+1}, P_{N+i}\}$. As explained above, each fragment 68 contains an index value (i) stored in index value field 70 and a projection value ($P_{N+1}$) stored in the projection value field 72. The value of the index field 70 in fragment 68 points to that one of the records 50 of dictionary 40 containing the desired value of $U_i$. The value $P_{N+1}$ as computed at block 84 is stored in the projection value 72 of the new fragment $\{i_{N+1}, P_{N+1}\}$. Thus, the new fragment contains a pointer (i) to the desired record of dictionary 40 and a corresponding projection value $P_{N+1}$. To achieve further loss compression, the value of $P_{N+1}$ can be quantized by mapping it to a finite set of integer values. This quantization if performed can be part of the encoding loop (as opposed to post processing) to provide better results.

Control then moves to block 88, where the repetition factor is determined for the new fragment record. In this case, the repetition factor can be an integer such as between 1 and 7, which determines how many duplicate copies of the fragment $\{i_{N+1}, P_{N+1}\}$ will be transmitted as part of output signal Y (FIG. 3). The repetition factor can be determined as a function of the importance of the fragment to the overall reconstructed signal. For example, the repetition factor for the $k^{th}$ fragment 68 in fragment list 42 can be a function of the absolute value of the scalar product of $<R,U_{i,k}>$, which in physical terms can be an indication of the transform energy associated with the fragment. In other words, a higher absolute value of scalar product of $<R,U_{i,k}>$ can indicate that the $k^{th}$ fragment containing the value $U_{i,k}$ is relatively more important than other fragments 68 and accordingly should be duplicated more times. The additional redundancy factor minimizes the effect of packet loss. That is, if the $k^{th}$ fragment is important and is duplicated three times (for example), there is an increased likelihood that at least one of the three copies will reach receiving station 24.

Control then moves to block 90, where the selected one of records 50 of dictionary 40 (that is, the record corresponding to the index (i) and desired value $U_1$) is marked so that it will not be selected again by the encoder for use in creating a fragment. Thus, each entry of dictionary 40 is used only once to generate a fragment 68, although that fragment may be duplicated in the output signal depending on the repetition factor for that fragment.

It will be understood that with each iteration of the process described in FIG. 9, fragments representing ever decreasing transform energy can be added to the fragment list. With each new fragment, the reconstructed signal REC has greater fidelity to the original input signal S. Fragments can be added until the resulting reconstructed signal REC is of sufficiently high quality (so that the residual signal R or a value based on residual signal R is at or below the threshold).

Figure 10:
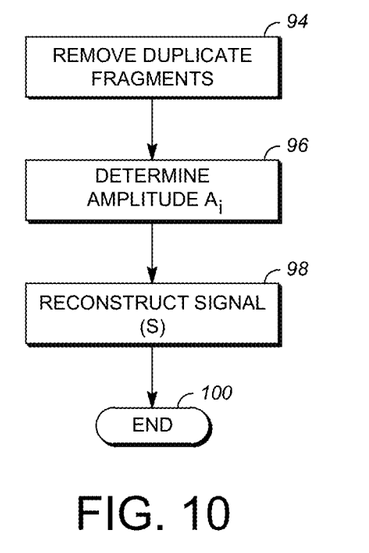
FIG. 10 is a logic flow chart illustrating operation of the decoder of FIG. 7.

FIG. 10 is a logic flow chart illustrating operation of the decoder stage 46 of FIG. 3 and decoder 60 of FIG. 7 in one illustrative embodiment. For convenience, the blocks of FIG. 10 are described with respect to decoder 60. Decoder stage 46 operates in substantially the same manner as decoder 60 except that decoder stage 46 uses as its input the fragment list 42 and dictionary 40 and its output is reconstructed signal REC. Decoder 60 processes as input a list of N fragments in the form of fragment list 62. As explained above, fragment list 62 can be identical to the fragment list 42 that is included in output signal Y, except that duplicate copies of important fragments in fragment list 42 may be included in output signal Y (and thus included in input fragment list 62) for purposes of redundancy as a countermeasure to the possibility of data loss during transmission on forward link 26 (FIG. 1). ). Accordingly, block 94 is included to remove duplicate fragments.

Also, despite redundancy, some fragments in fragment list 42 that are included in output signal Y may be lost during transmission on forward link 26 and therefore such lost fragments will not be included in input fragment list 62. Thus, in an exemplary case, if there are no duplicate copies of fragments in output signal Y and no transmission losses, fragment list 62 can be identical to fragment list 42 after encoding is complete. It should be noted that transmission of fragment list 42 (as included in output signal Y) can be performed on a frame-by-frame basis so that the entire video or audio stream need not be encoded before fragments are transmitted.

Control next moves to a block 96, where the amplitude $A_k$ for each $k^{th}$ fragment is determined based upon the value $P_k$ contained in the $k^{th}$ fragment's projection field 72. One exemplary technique for computing amplitude $A_k$ is to solve the following linear system for the unknown coefficient $A_j$ $$\forall k \in k \sum_{j=1}^{N} A_j * <U_{i,k}, U_{i,j}> = P_k \qquad \text{(Equation 3)}$$

where the index k refers to the $k^{th}$ entry in deduplicated fragment list 62. Other techniques can be used to find the amplitude.

Control next moves to a block 98, where the reconstructed signal REC is determined using the values of amplitude $A_k$. One exemplary technique for computing REC is to compute the sum of the dictionary values $U_{i,k}$ weighted by the corresponding amplitudes in accordance with the following equation:

$$REC = \sum_{k=1} A_k * U_{i,k} \qquad \text{(Equation 4)}$$

where k ranges from 1 to N, the total number of fragments, $A_k$ is determined by solving the linear system described in Equation 3 above; and $U_{i,k}$ is the dictionary value at that one of dictionary records 50 to which the $k^{th}$ fragment's index (i) points.

Control next moves to block 100, where processing of FIG. 10 terminates.

In a physical sense, the amplitude $A_k$ associated with each fragment 68 is a measure of the amplitude of that fragment's normalized dictionary value $U_{i,k}$. The projection $P_k$ is a transform of that amplitude value. By transmitting the projection values $P_k$, more robust communications may be provided than if, for example, the amplitudes $A_i$ themselves were transmitted. This is because the loss of an amplitude $A_k$ value can result in a more severe degradation of the reconstructed signal REC than the loss of a projection value $P_k$.

The functions of encoder 32 and decoder 60 can be implemented as an application computer program or other software that can be executed a computing device such as processing unit 28. Alternatively, the logic of encoder 32 and decoder 60 implemented in hardware such as in firmware or on an ASIC or other specialized chip, or in a combination of hardware and software. All or a portion of embodiments of the present invention can take the form of a computer program product accessible from, for example, a computer-usable or computer-readable medium. A computer-usable or computer-readable medium can be any signal device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A computer-implemented method for decoding an encoded data signal, comprising:
    accessing in a memory a set of signal elements;
    receiving, at a computing device, the encoded data signal including a plurality of signal fragments each having: (i) a projection value that has been calculated as a function of at least one signal element of the set of signal elements and at least a portion of the encoded data signal; and (ii) a value associating each respective signal fragment with the at least one signal element used to calculate the projection value;
    determining, by the computing device, a plurality of amplitude values wherein at least one of the plurality of amplitude values is based on the projection value in at least one of the plurality of signal fragments; and
    determining a decoded signal using the plurality of amplitude values and signal elements associated with the at least one of the plurality of signal fragments.

2. The method of claim 1, further comprising:
    de-duplicating the plurality of signal fragments.

3. The method of claim 1, wherein determining the plurality of amplitudes further comprises solving a linear system.

4. The method of claim 1, wherein the set of signal elements is a dictionary of signal elements having a plurality of records each including an index (i) and a signal element ($U_i$).

5. The method of claim 4, wherein a $k^{th}$ amplitude value ($A_k$) of the plurality of amplitude values is based on the projection value of a $k^{th}$ signal fragment and is determined by solving the following linear system:

$$\forall k \in k \sum_{j=1}^{N} A_j * <U_{i,k}, U_{i,j}> = P_k$$

wherein $A_j$ is a coefficient to determine through solution of the linear system; N is a number of signal fragments in the plurality of signal fragments; $U_{i,k}$ is the signal element in the set of signal elements to which points the index (i) in the $k^{th}$ signal fragment of the plurality of signal fragments; $U_{i,j}$ is the signal element in the set of signal elements to which points the index (i) in a $j^{th}$ signal fragment of the plurality of signal fragments; and $P_k$ is the projection value in the $k^{th}$ signal fragment of the plurality of signal fragments.

6. The method of claim 5, wherein determining the decoded signal using the plurality of amplitude values and the signal elements associated with the at least one of the plurality of signal fragments further comprises determining at least a portion of the decoded signal REC based on a result of the following summation:

$$REC = \sum_{k=1} A_k * U_{i,k}.$$

where $A_k$ is the amplitude determined based on the projection value of the $k^{th}$ signal fragment; and $U_{i,k}$ is the signal element in the set of signal elements to which points the index (i) in the $k^{th}$ signal fragment of the plurality of signal fragments.

7. The method of claim 1, wherein determining the decoded signal using the plurality of amplitude values and the signal elements associated with the at least one of the plurality of signal fragments further comprises:

determining a weighted sum of the signal elements, wherein a weight of each signal element is based on at least one of the plurality of amplitude values.

8. The method of claim 1, further comprising:
periodically receiving, in the memory, at least an updated portion of the set of signal elements.

9. A computer-implemented method for decoding an encoded data signal, comprising:
accessing in a memory a set of signal elements;
receiving, at a computing device, the encoded data signal including a plurality of signal fragments each having a projection value and an index value;
identifying, from the set of signal elements stored in the memory, a plurality of selected signal elements, at least one of which corresponds to the index value in at least one of the plurality of signal fragments; and
determining, by the computing device, a decoded data signal based on the plurality of selected signal elements and at least one projection value included in the plurality of signal fragments.

10. The method of claim 9, wherein the at least one projection value is calculated as a function of at least one signal element of the set of signal elements and at least a portion of the encoded data signal.

11. The method of claim 9, wherein the index value in the at least one of the plurality of signal fragments associates its respective signal fragment with at least one signal element used to calculate the projection value.

12. The method of claim 9, wherein determining, by the computing device, the decoded data signal based on the plurality of selected signal elements and the at least one projection value, further comprises:
determining, by the computing device, a plurality of amplitude values based at least in part on the projection value in at least one of the plurality of signal fragments; and
determining the decoded data signal using the plurality of amplitude values and the plurality of selected signal elements.

13. The method of claim 12, wherein determining the plurality of amplitude values further comprises solving a linear system.

14. The method of claim 12, wherein determining the decoded signal using the plurality of amplitude values and the plurality of selected signal elements further comprises:
determining a weighted sum of the plurality of selected signal elements, wherein a weight of each of the plurality of selected signal elements is based on at least one of the plurality of amplitude values.

15. The method of claim 9, further comprising:
de-duplicating the plurality of signal fragments from the encoded data signal.

16. An apparatus for decoding an encoded data signal, comprising:
a memory including a set of signal elements; and
a processor in communication with the memory and configured to execute instructions to:
receive the encoded data signal including a plurality of signal fragments each having a projection value and an index value;
identifying, using at least one index value included in the plurality of signal fragments, a plurality of selected signal elements in the set of signal elements; and
determining a decoded data signal based on the plurality of selected signal elements and at least one projection value included in the plurality of signal fragments.

17. The apparatus of claim 16, further comprising:
a receiver adapted to receive a satellite signal that includes the encoded data signal.

18. The apparatus of claim 16, wherein the projection value of at least one of the plurality of signal fragments is calculated as a function of at least one signal element of the set of signal elements and at least a portion of the encoded data signal.

19. The apparatus of claim 16, wherein at least one index value points to one of the plurality of signal fragments that was used to calculate the at least one projection value.

20. The apparatus of claim 16, wherein the processor is further configured to execute instructions to:
determine a plurality of amplitude values based at least in part on the projection value in at least one of the plurality of signal fragments; and
determine the decoded data signal using the plurality of amplitude values and the plurality of selected signal elements.

* * * * *

UNITED STATES PATENT AND TRADEMARK OFFICE
CERTIFICATE OF CORRECTION

| | | |
|---|---|---|
| PATENT NO. | : 8,907,821 B1 | |
| APPLICATION NO. | : 13/489025 | |
| DATED | : December 9, 2014 | |
| INVENTOR(S) | : Pascal Massimino | |

It is certified that error appears in the above-identified patent and that said Letters Patent is hereby corrected as shown below:

On the Title Page

Page 1, item (54), and in the Specification, Column 1, Title should read: APPARATUS AND METHOD FOR DECODING DATA USING SIGNAL FRAGMENTS Page 3, Column 1, References Cited, Line 9, "Begen" Reference: "wit" should be "with"

Page 3, Column 1, References Cited, Line 35, "He" Reference: "Technogy" should be "Technology"

Page 3, Column 2, References Cited, Line 45, "Sunil" Reference: "Communicatio" should be "Communication"

Signed and Sealed this
Twenty-fourth Day of March, 2015

Michelle K. Lee
*Director of the United States Patent and Trademark Office*